(12) United States Patent
Sasaki

(10) Patent No.: US 11,375,620 B2
(45) Date of Patent: *Jun. 28, 2022

(54) MULTI-LAYER CERAMIC ELECTRONIC COMPONENT, METHOD OF PRODUCING A MULTI-LAYER CERAMIC ELECTRONIC COMPONENT, AND SUBSTRATE WITH A BUILT-IN ELECTRONIC COMPONENT

(71) Applicant: Taiyo Yuden Co., Ltd., Tokyo (JP)

(72) Inventor: Takashi Sasaki, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/364,064

(22) Filed: Jun. 30, 2021

(65) Prior Publication Data

US 2021/0329786 A1 Oct. 21, 2021

Related U.S. Application Data

(63) Continuation of application No. 16/511,651, filed on Jul. 15, 2019, now Pat. No. 11,083,090.

(30) Foreign Application Priority Data

Jul. 23, 2018 (JP) .............................. JP2018-137508

(51) Int. Cl.
*H05K 1/18* (2006.01)
*H01G 4/224* (2006.01)
(Continued)

(52) U.S. Cl.
CPC ............. *H05K 1/186* (2013.01); *H01G 4/224* (2013.01); *H01G 4/232* (2013.01); *H01G 4/248* (2013.01);
(Continued)

(58) Field of Classification Search
CPC .......... H01B 3/30; H01B 3/224; H01B 3/232; H01B 3/248; H01B 3/1227; H05K 1/182;
(Continued)

(56) References Cited

U.S. PATENT DOCUMENTS 9,439,288 B2    9/2016    Takizawa et al.
9,818,547 B1 *  11/2017   Yoon ..................... H01G 4/248
(Continued)

FOREIGN PATENT DOCUMENTS

CN    102347315 A    2/2012
CN    104508772 A    4/2015
(Continued)

OTHER PUBLICATIONS

Office Action dated Nov. 29, 2019 in U.S. Appl. No. 16/511,651.
(Continued)

*Primary Examiner* — Paresh Paghadal
(74) *Attorney, Agent, or Firm* — Saliwanchik, Lloyd & Eisenschenk

(57) ABSTRACT

A multi-layer ceramic electronic component includes: a ceramic body including internal electrodes laminated in one axial direction and having a main surface facing in the one axial direction; and an external electrode including a base layer including a step portion formed on the main surface, and a plated layer formed on the base layer, the external electrode being connected to the internal electrodes.

20 Claims, 15 Drawing Sheets

(51) Int. Cl.
*H01G 4/248* (2006.01)
*H01G 4/232* (2006.01)

(52) U.S. Cl.
CPC ............. *H05K 1/182* (2013.01); *H05K 1/183* (2013.01); *H05K 1/185* (2013.01); *H05K 2201/09154* (2013.01); *H05K 2201/09827* (2013.01); *H05K 2201/09854* (2013.01); *H05K 2201/10015* (2013.01); *H05K 2201/10636* (2013.01)

(58) Field of Classification Search
CPC ........ H05K 1/183; H05K 1/185; H05K 1/186; H05K 2201/09154; H05K 2201/09027; H05K 2201/09854; H05K 2201/10015; H05K 2201/10636
See application file for complete search history.

(56) References Cited

U.S. PATENT DOCUMENTS

| | | | |
|---|---|---|---|
| 9,844,393 B2 | 12/2017 | Poucher | |
| 9,877,393 B2 | 1/2018 | Nishimura | |
| 9,892,855 B2 | 2/2018 | Ando et al. | |
| 9,978,518 B2 | 5/2018 | Nishisaka | |
| 10,187,994 B2 | 1/2019 | You et al. | |
| 10,204,739 B1 | 2/2019 | Ji et al. | |
| 10,283,271 B2 | 5/2019 | Nishimura et al. | |
| 10,347,425 B2 | 7/2019 | Park et al. | |
| 2009/0002920 A1 | 1/2009 | Itamura et al. | |
| 2009/0040688 A1 | 2/2009 | Kayatani | |
| 2010/0155124 A1 | 6/2010 | Kawamura et al. | |
| 2010/0202098 A1 | 8/2010 | Yanagida et al. | |
| 2012/0018204 A1 | 1/2012 | Sato et al. | |
| 2013/0048361 A1* | 2/2013 | Yamashita | ........ H01L 23/49822 174/260 |
| 2014/0144676 A1 | 5/2014 | Chung et al. | |
| 2014/0174800 A1* | 6/2014 | Chang | .................... H01G 4/224 361/306.3 |
| 2014/0290999 A1 | 10/2014 | Park et al. | |
| 2015/0060122 A1 | 3/2015 | Lee et al. | |
| 2015/0170838 A1 | 6/2015 | Suzuki et al. | |
| 2016/0005539 A1 | 1/2016 | Lee et al. | |
| 2016/0374223 A1* | 12/2016 | Xu | ........................ H05K 7/1432 |
| 2017/0018361 A1 | 1/2017 | Nishisaka | |
| 2017/0127521 A1 | 5/2017 | You et al. | |
| 2018/0268999 A1 | 9/2018 | Shimada et al. | |
| 2018/0323010 A1 | 11/2018 | Park et al. | |
| 2018/0366248 A1 | 12/2018 | Maruyama et al. | |
| 2019/0189348 A1 | 6/2019 | Choi et al. | |
| 2019/0387630 A1 | 12/2019 | Belman | |

FOREIGN PATENT DOCUMENTS

| | | |
|---|---|---|
| JP | 2010-153767 A | 7/2010 |
| JP | 2012-28457 A | 2/2012 |
| JP | 2013-51336 A | 3/2013 |
| JP | 2014-192321 A | 10/2014 |
| JP | 2015-8313 A | 1/2015 |

OTHER PUBLICATIONS

Office Action dated May 15, 2020 in U.S. Appl. No. 16/511,651.
Office Action dated Sep. 15, 2020 in U.S. Appl. No. 16/511,651.
Office Action dated Feb. 18, 2021 in U.S. Appl. No. 16/511,651.
Notice of Allowance dated Apr. 20, 2021 in U.S. Appl. No. 16/511,651.
Office Action dated Nov. 17, 2021 in Japanese Application No. 2018-137508.
Office Action dated Jan. 18, 2022 in Chinese Application No. 201910660187.0.

\* cited by examiner

MULTI-LAYER CERAMIC ELECTRONIC COMPONENT, METHOD OF PRODUCING A MULTI-LAYER CERAMIC ELECTRONIC COMPONENT, AND SUBSTRATE WITH A BUILT-IN ELECTRONIC COMPONENT

CROSS-REFERENCE TO RELATED APPLICATIONS

This application is a continuation of U.S. application Ser. No. 16/511,651, filed Jul. 15, 2019; which claims the benefit of Japanese Application No. 2018-137508, filed Jul. 23, 2018, which is hereby incorporated by reference in its entirety.

BACKGROUND

The present disclosure relates to a multi-layer ceramic electronic component such as a multi-layer ceramic capacitor, a method of producing the multi-layer ceramic electronic component, and a substrate with a built-in electronic component, the substrate housing the multi-layer ceramic electronic component.

In the past, a substrate with a built-in electronic component, which houses an electronic component such as a multi-layer ceramic capacitor, has been known.

For example, Japanese Patent Application Laid-open No. 2010-153767 discloses a wiring board with a built-in electronic component. The wiring board includes a conductive pattern, a capacitor including an electrode connected to the conductive pattern by a via hole, and a substrate where the capacitor is built into. The substrate includes, for example, an insulation layer made of cured prepreg, a thermosetting resin, or the like.

SUMMARY

The wiring board with a built-in electronic component having the above-mentioned configuration has different thermal expansion coefficients between the substrate including an insulating material and the capacitor including ceramics. Because of this, when the wiring board with a built-in electronic component is heated or cooled, the substrate and the capacitor expand and contract at different ratios. So, stress is applied between the electrode of the capacitor and the via hole, which makes it difficult to improve connection reliability.

In view of the circumstances as described above, it is desirable to provide a multi-layer ceramic electronic component capable of improving connection reliability in an external electrode, a method of producing the multi-layer ceramic electronic component, and a substrate with a built-in electronic component, the substrate housing the multi-layer ceramic electronic component.

According to an embodiment of the present disclosure, there is provided a multi-layer ceramic electronic component including a ceramic body and an external electrode.

The ceramic body includes internal electrodes laminated in one axial direction and has a main surface facing in the one axial direction.

The external electrode includes a base layer including a step portion formed on the main surface, and a plated layer formed on the base layer, the external electrode being connected to the internal electrodes.

With the configuration described above, the plated layer is formed along the base layer, and a difference in level resulting from the step portion is formed also on the surface of the external electrode. In other words, in the case where the multi-layer ceramic electronic component is incorporated in or mounted to a wiring substrate, a difference in level can be provided at a boundary of connection with a connection electrode such as a via or solder.

Accordingly, an area at the connection boundary can be increased. Additionally, since the external electrode and the connection electrode are also joined in a direction other than one axial direction, the release of the joint of those electrodes also needs a force in the direction other than the one axial direction.

In other words, in the case where the multi-layer ceramic electronic component is incorporated in or mounted to the wiring substrate, stress in the one axial direction is applied to the connection boundary due to heating and cooling at the time of drive, whereas the configuration described above can enhance connection strength of the external electrode against the stress. So, the connection reliability in the external electrode can be enhanced.

Specifically, the step portion may have a height dimension of 1 μm or more and 15 μm or less along the one axial direction.

Additionally, the step portion may have a height dimension of 2 μm or more and 5 μm or less along the one axial direction.

Accordingly, it is possible to effectively enhance the connection reliability without hindering the miniaturization of the multi-layer ceramic electronic component.

The step portion may include a plurality of step portions formed on the main surface.

Accordingly, it is possible to further increase a connection area of the external electrode and the connection electrode such as a via or solder. Further, force in various orientations corresponding to the orientation of the step surface is used to break the boundary of connection between the external electrode and the connection electrode. This can provide a configuration more difficult to break at the connection boundary.

According to another embodiment of the present disclosure, there is provided a method of producing a multi-layer ceramic electronic component, the method including: producing a ceramic body, the ceramic body including internal electrodes laminated in one axial direction and having a main surface facing in the one axial direction; forming a base layer, the base layer including a step portion formed on the main surface and being connected to the internal electrodes; and forming a plated layer on the base layer.

According to still another embodiment of the present disclosure, there is provided a substrate with a built-in electronic component, including a multi-layer ceramic electronic component, a housing layer, and a wiring layer.

The multi-layer ceramic electronic component includes a ceramic body and an external electrode.

The ceramic body includes internal electrodes laminated in one axial direction and has a main surface facing in the one axial direction.

The external electrode includes a base layer including a step portion formed on the main surface, and a plated layer formed on the base layer, the external electrode being connected to the internal electrodes.

The housing layer houses the multi-layer ceramic electronic component.

The wiring layer includes an insulating layer formed on the housing layer, a conductor layer formed on the insulating layer, and a connection electrode connected to the external electrode and the conductor layer and formed in the insulating layer to face the step portion in the one axial direction.

In the configuration described above, the connection electrode is formed to face the step portion in one axial direction, and the area at the connection boundary can be increased.

Further, since the step portion joins the external electrode and the connection electrode via the difference in level, in order to release the joint of those electrodes, a force in a direction other than the one axial direction is also necessary. This can enhance the connection strength of the external electrode and the connection electrode against the stress to be applied due to heating and cooling of the substrate with a built-in electronic component. So, it is possible to enhance the connection reliability in the multi-layer ceramic electronic component and the connection electrode.

The step portion may include a plurality of step portions formed for the connection electrode.

Alternatively, the connection electrode may include a plurality of connection electrodes formed for the step portion.

Accordingly, it is possible to further enlarge the connection area of the external electrode and the connection electrode and to further enhance the connection strength.

As described above, according to the present disclosure, it is possible to provide a multi-layer ceramic electronic component capable of improving connection reliability in an external electrode, a method of producing the multi-layer ceramic electronic component, and a substrate with a built-in electronic component, the substrate housing the multi-layer ceramic electronic component.

These and other objects, features and advantages of the present disclosure will become more apparent in light of the following detailed description of embodiments thereof, as illustrated in the accompanying drawings.

DETAILED DESCRIPTION OF EMBODIMENTS

Hereinafter, embodiments of the present disclosure will be described with reference to the drawings.

In the figures, an X axis, a Y axis, and a Z axis orthogonal to one another are shown as appropriate. The X axis, the Y axis, and the Z axis are common in all figures.

I First Embodiment

1. Configuration of Multi-Layer Ceramic Capacitor 10

Figure 1:
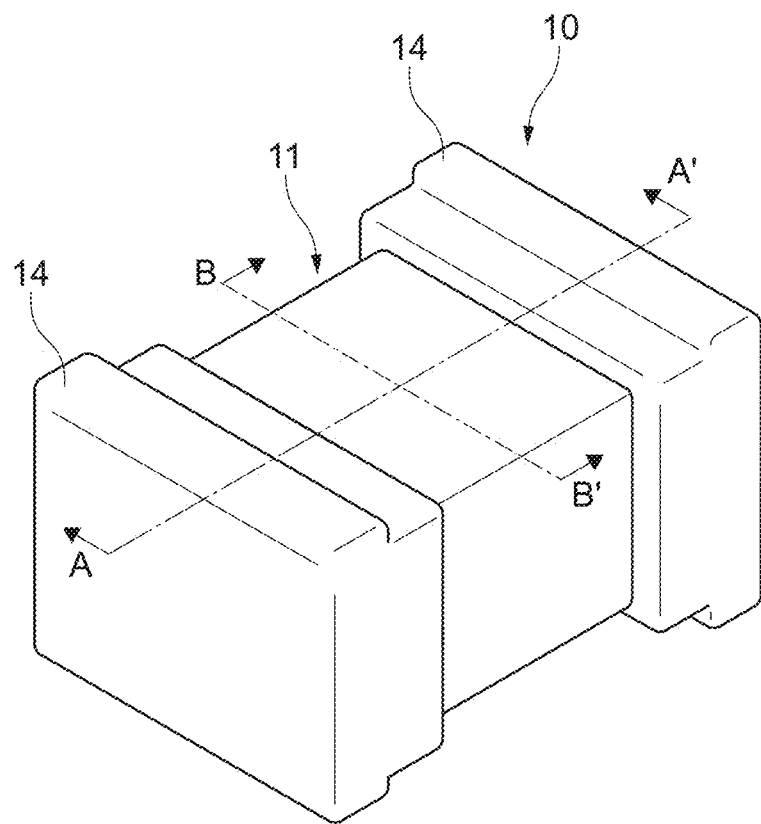
FIG. 1 is a perspective view of a multi-layer ceramic capacitor according to a first embodiment of the present disclosure.
Figure 1:
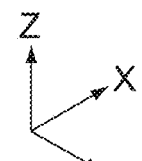
Figure 2:
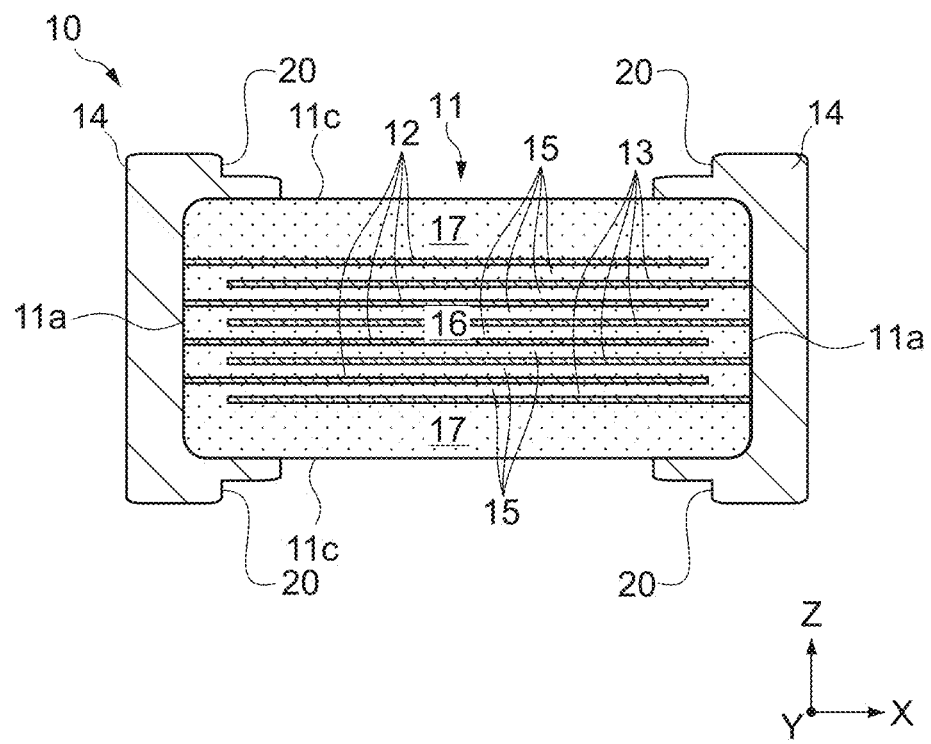
FIG. 2 is a cross-sectional view of the multi-layer ceramic capacitor taken along the A-A' line in FIG. 1.
Figure 3:
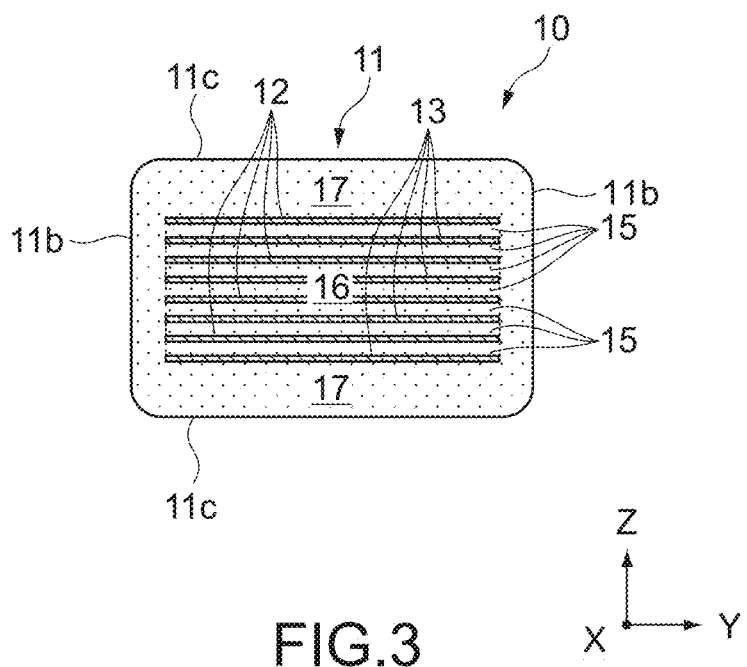
FIG. 3 is a cross-sectional view of the multi-layer ceramic capacitor taken along the B-B' line in FIG. 1.

FIGS. 1 to 3 each show a multi-layer ceramic capacitor 10 according to a first embodiment of the present disclosure. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 includes a ceramic body 11 and external electrodes 14. In this embodiment, the ceramic body 11 is long in the X-axis direction and is configured to have a rectangular parallelepiped shape as a whole.

The ceramic body 11 typically has two end surfaces 11a facing in the X-axis direction, two side surfaces 11b facing in the Y-axis direction, and two main surfaces 11c facing in the Z-axis direction. The external electrodes 14 are formed on the respective end surfaces 11a. Ridges connecting the surfaces of the ceramic body 11 may be chamfered.

Note that the surfaces of the ceramic body 11 may be curved surfaces, and the ceramic body 11 may be rounded as a whole.

The ceramic body 11 includes a capacitance forming unit 16 and a protective portion 17. The capacitance forming unit 16 includes a plurality of ceramic layers 15, a plurality of first internal electrodes 12, and a plurality of second internal electrodes 13, which are laminated. The protective portion 17 covers regions of the main surfaces 11c, which face in the Z-axis direction, of the capacitance forming unit 16 and also covers all regions of the side surfaces 11b facing in the Y-axis direction.

The first and second internal electrodes 12 and 13 are alternately disposed along the Z-axis direction between the ceramic layers 15 laminated in the Z-axis direction. The first internal electrodes 12 are drawn to one of the end surfaces 11a and are apart from the other end surface 11a. The second internal electrodes 13 are apart from the one end surface 11a to which the first internal electrodes 12 are drawn, and are drawn to the other end surface 11a.

The first and second internal electrodes 12 and 13 typically contain nickel (Ni) as a main component and function as internal electrodes of the multi-layer ceramic capacitor 10. Note that the first and second internal electrodes 12 and 13 may contain, as a main component, copper (Cu), silver (Ag), palladium (Pd), or the like other than nickel.

The ceramic layers 15 are made of dielectric ceramics. The ceramic layers 15 are made of dielectric ceramics having a high dielectric constant in order to increase the capacitance of the capacitance forming unit 16.

For the dielectric ceramics having a high dielectric constant, a polycrystal of a barium titanate ($BaTiO_3$) based material, i.e., a polycrystal having a Perovskite structure containing barium (Ba) and titanium (Ti) is used. This provides a multi-layer ceramic capacitor 10 having a large capacitance.

Note that the ceramic layers 15 may be made of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

The protective portion 17 is also made of dielectric ceramics. The material of the protective portion 17 only needs to be insulating ceramics, but if dielectric ceramics similar to that of the ceramic layers 15 is used therefor, internal stress in the ceramic body 11 is to be suppressed to be small.

The protective portion 17 covers the surfaces of the capacitance forming unit 16 other than the end surfaces 11a. The protective portion 17 has main functions of protecting the periphery of the capacitance forming unit 16 and ensuring insulation properties for the first and second internal electrodes 12 and 13.

Hereinafter, a region of the protective portion 17 on the main surface 11c side is referred to as a cover region, and a region of the protective portion 17 on the side surface 11b side is referred to as a side margin region.

The external electrodes 14 cover the end surfaces 11a and extend to the main surfaces 11c and the side surfaces 11b. One of the external electrodes 14 is connected to the first internal electrodes 12 on one of the end surfaces 11a, and the other external electrode 14 is connected to the second internal electrodes 13 on the other end surface 11a.

Each of the external electrodes 14 has a multi-layer structure. Hereinafter, a detailed configuration thereof will be described.

2. Detailed Configuration of External Electrode 14

Figure 4:
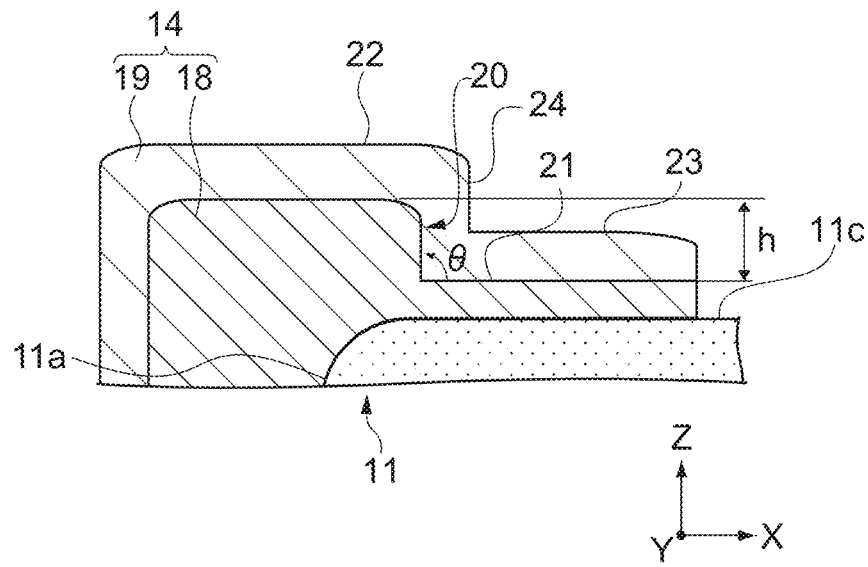
FIG. 4 is an enlarged view of FIG. 2 and also a view showing a configuration of an external electrode of the multi-layer ceramic capacitor.

FIG. 4 is an enlarged view of FIG. 2 and also a view showing the configuration of the external electrode 14.

The external electrode 14 includes a base layer 18 and a plated layer 19. The base layer 18 is formed on the surface of the ceramic body 11. The plated layer 19 is formed on the base layer 18.

The base layer 18 may be a baked film of an electrically conductive paste mainly containing metal or an alloy. The material of the base layer 18 is favorably nickel (Ni), for example, and may be a metal material such as copper (Cu) or silver (Ag) or may be an alloy or a composite material containing an additive.

The base layer 18 includes a step portion 20 formed on the main surface 11c. The step portion 20 is a portion of the base layer 18, the portion having a height different from that of a base 21 in the Z-axis direction and having an angle θ formed together with the base 21 in the range from 60 degrees to 135 degrees. In the example of FIG. 4, the angle θ formed by the step portion 20 and the base 21 is approximately 90 degrees.

The step portion 20 has a height dimension h of, for example, 1 μm or more and 15 μm or less, more favorably 2 μm or more and 5 μm or less, along the Z-axis direction. The height dimension h of the step portion 20 is a dimension along the Z-axis direction from the base 21 to the most protruding portion in the Z-axis direction.

The plated layer 19 can be a plated film of metal mainly containing copper, nickel, tin (Sn), platinum (Pt), palladium (Pd), gold (Au), or the like or an alloy thereof. The plated layer 19 may have a single-layer structure or a multi-layer structure. In the latter case, materials of the respective layers may be the same or different.

The plated layer 19 is formed to have a substantially uniform thickness dimension from the surface of the base layer 18 and is formed along the shape of the base layer 18. The thickness dimension of the plated layer 19 from the surface of the base layer 18 is, for example, 1 to 15 μm.

With the configuration described above, the plated layer 19 is also provided with a difference in level resulting from the shape of the step portion 20. The surface of the plated layer 19, i.e., the surface of the external electrode 14 includes, on the main surface 11c, an upper stage surface 22, a lower stage surface 23, and a standing surface 24 that connects the upper stage surface 22 and the lower stage surface 23.

The standing surface 24 is a surface formed on the surface of the plated layer 19 so as to correspond to the step portion 20. The standing surface 24 is a surface that covers the step portion 20 and has an angle formed together with the lower stage surface 23 in the range of 60 degrees or more and 135 degrees or less.

With the standing surface 24 formed on the surface of the external electrode 14, connection reliability when the external electrodes 14 and wiring on a wiring substrate are connected to each other can be enhanced, as will be described later.

3. Method of Producing Multi-Layer Ceramic Capacitor 10

Figure 5:
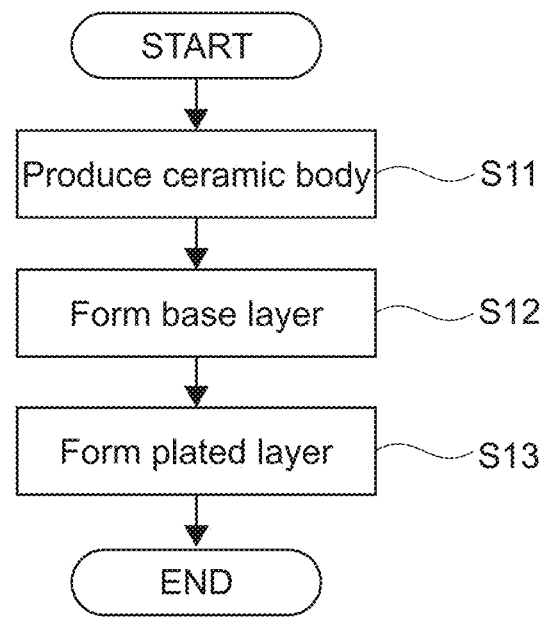
FIG. 5 is a flowchart showing a method of producing the multi-layer ceramic capacitor.
Figure 6:
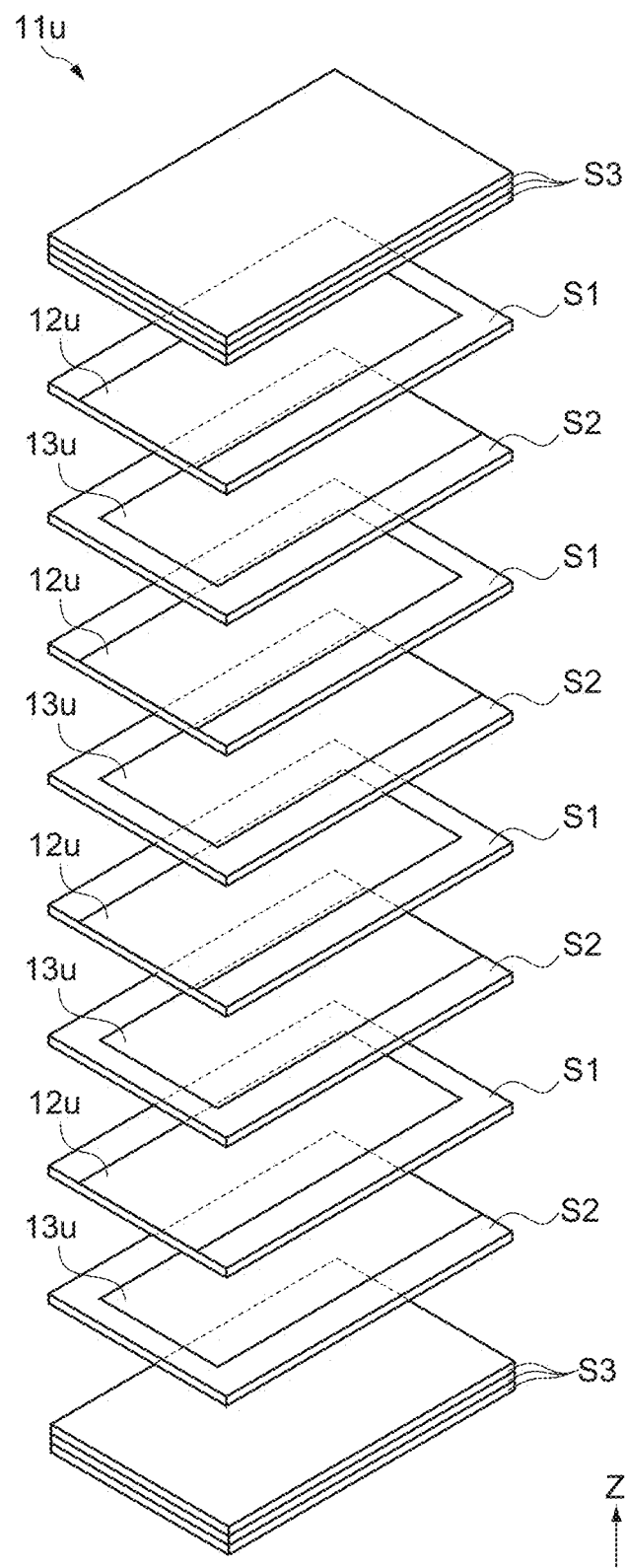
FIG. 6 is a perspective view showing a production process of the multi-layer ceramic capacitor.
Figure 7A:
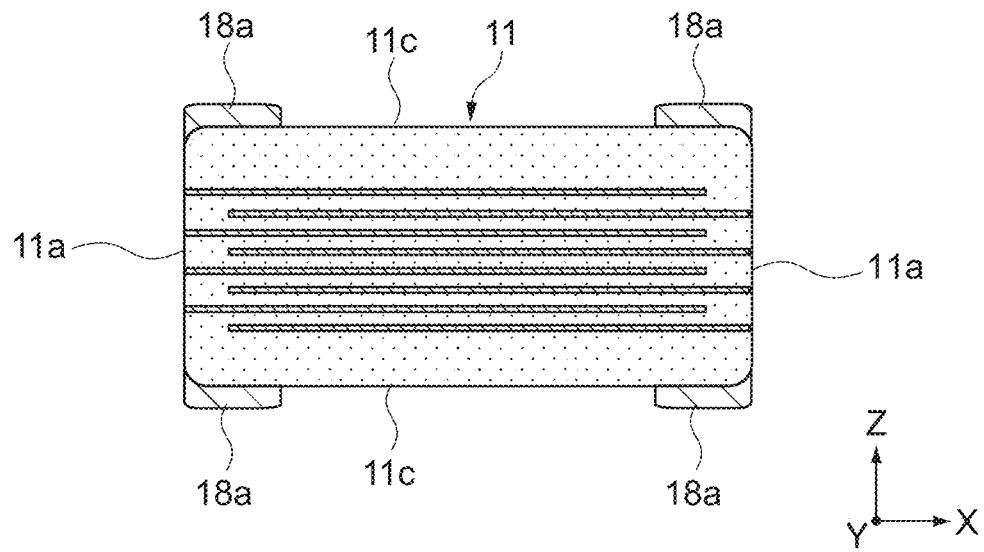
FIGS. 7A and 7B are cross-sectional views each showing a production process of the multi-layer ceramic capacitor.
Figure 7B:
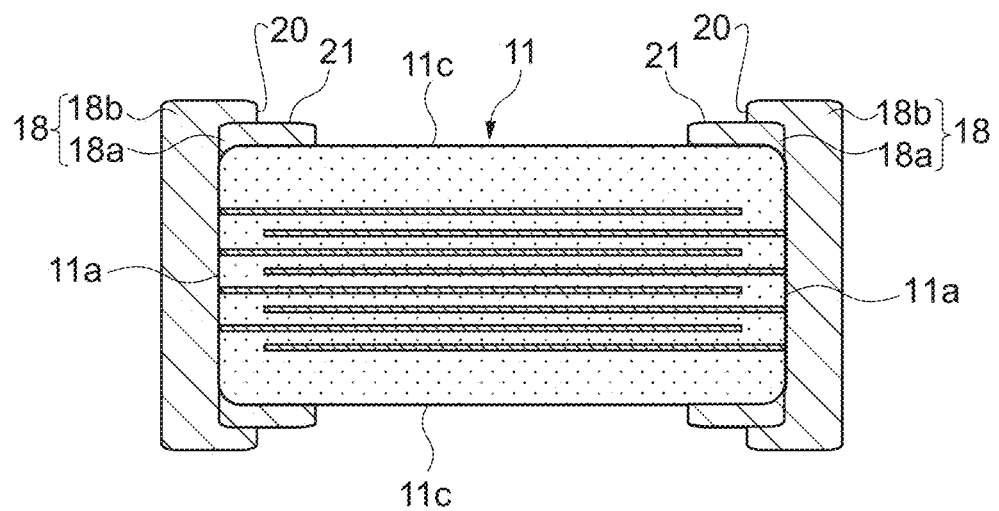

FIG. 5 is a flowchart showing a method of producing the multi-layer ceramic capacitor 10. FIGS. 6, 7A, and 7B are views each showing a production process of the multi-layer ceramic capacitor 10. Hereinafter, the method of producing the multi-layer ceramic capacitor 10 will be described according to FIG. 5 with reference to FIGS. 6, 7A, and 7B as appropriate.

3.1 Step S11: Production of Ceramic Body 11

In Step S11, first ceramic sheets S1 and second ceramic sheets S2 for forming the capacitance forming unit 16, and third ceramic sheets S3 for forming the cover regions of the protective portion 17 are prepared. Subsequently, as shown in FIG. 6, the first, second, and third ceramic sheets S1, S2, and S3 are laminated and sintered, thus producing the ceramic body 11.

The first, second, and third ceramic sheets S1, S2, and S3 are formed as unsintered dielectric green sheets mainly containing dielectric ceramics.

Unsintered first internal electrodes 12u corresponding to the first internal electrodes 12 are formed on the first ceramic sheets S1. Unsintered second internal electrodes 13u corresponding to the second internal electrodes 13 are formed on the second ceramic sheets S2. In each of the first and second ceramic sheets S1 and S2, a region is provided in the circumference of each of the first and second internal electrodes $12u$ and $13u$ in the Y-axis direction. The region corresponds to the side margin region of the protective portion 17 and does not include the first and second internal electrodes $12u$ and $13u$. Internal electrodes are not formed on the third ceramic sheets S3.

In an unsintered ceramic body $11u$ shown in FIG. 6, the first and second ceramic sheets S1 and S2 are alternately laminated, and the third ceramic sheets S3 corresponding to the cover regions are laminated on the upper and lower surfaces of the laminate of the first and second ceramic sheets S1 and S2 in the Z-axis direction. The unsintered ceramic body $11u$ is integrated by pressure-bonding the first, second, and third ceramic sheets S1, S2, and S3. Note that the number of first, second, and third ceramic sheets S1, S2, and S3 is not limited to the example shown in FIG. 6.

Note that, while the unsintered ceramic body $11u$ corresponding to the single ceramic body 11 has been described above, in actually, a multi-layer sheet configured as a large-sized sheet, which is not singulated, is formed and then singulated into the ceramic bodies $11u$.

By sintering the unsintered ceramic body $11u$, the ceramic body 11 shown in FIGS. 1 to 3 is produced.

A sintering temperature can be determined on the basis of a sintering temperature for the ceramic body $11u$. For example, in the case where a barium titanate based material is used as dielectric ceramics, the sintering temperature can be set to approximately 1,000 to 1,300° C. Further, sintering can be performed in a reduction atmosphere or a low-oxygen partial pressure atmosphere, for example.

3.2 Step S12: Formation of Base Layer

In Step S12, an electrically conductive paste is applied to and baked onto the end surfaces $11a$ and the main surfaces $11c$ of the ceramic body 11, to form the base layers 18 of the external electrodes 14.

The electrically conductive paste contains, for example, a metal material or an organic binder and is applied onto each main surface $11c$ so as to form the step portion 20. Examples of the metal material include nickel (Ni), but the metal material may contain another metal material such as copper (Cu) or silver (Ag) or may be an alloy. Further, the electrically conductive paste may contain an additive other than the materials described above.

The method of forming the base layer 18 is as follows. First, as shown in FIG. 7A, a first base layer $18a$ is formed in a circumferential portion of each main surface $11c$ in the X-axis direction, i.e., in a region on each end surface $11a$ side. The first base layer $18a$ is the base 21 of FIG. 4.

Next, as shown in FIG. 7B, a second base layer $18b$ is formed so as to cover a part of the first base layer $18a$ and the end surface $11a$.

Accordingly, the step portion 20 is formed along the end portion of the second base layer $18b$ on the first base layer $18a$.

Examples of the method of applying the first base layer $18a$ include printing. This allows the first base layer $18a$ to be formed highly accurately in the circumferential portion of the main surface $11c$ in the X-axis direction.

Examples of the method of applying the second base layer $18b$ include dipping and printing.

For example, in the case where the second base layer $18b$ is formed by dipping, the end portion of the ceramic body 11 in the X-axis direction, at which the first base layer $18a$ is formed, is immersed into a dip tank filled with an electrode material and then pulled up. At that time, a portion from the end surface $11a$ to a part of the first base layer $18a$ is immersed into the dip tank, and thus the step portion 20 can be formed.

In the case where dipping is applied, the height dimension h of the step portion 20 in the Z-axis direction can be adjusted by adjustment of the viscosity of the electrically conductive paste. Specifically, as the viscosity of the electrically conductive paste becomes larger, the height dimension h of the step portion 20 tends to become smaller, and as the viscosity of the electrically conductive paste becomes smaller, the height dimension h of the step portion 20 tends to become larger. The viscosity of the electrically conductive paste can be set in the range of 50 to 500 ps. By the dipping, the step portion 20 can be formed with high accuracy, and the electrically conductive paste can be simultaneously applied onto the end surface $11a$.

Alternatively, the second base layer $18b$ may be formed by printing. This allows the step portion 20 to be formed with high positional accuracy even if the multi-layer ceramic capacitor 10 is miniaturized.

The baking of the first base layer $18a$ and the second base layer $18b$ may be independently or simultaneously performed.

For example, after the first base layer $18a$ is applied to the main surface $11c$ and then baked, the second base layer $18b$ may be applied and baked. In this case, the first base layer $18a$ may be formed on the unsintered ceramic body $11u$ and then sintered simultaneously with sintering of the ceramic body $11u$.

Alternatively, after the first base layer $18a$ is applied to the main surface $11c$ and the second base layer $18b$ is further applied onto the unsintered first base layer $18a$, the first base layer $18a$ and the second base layer $18b$ may be simultaneously sintered.

3.3 Step S13: Formation of Plated Layer 19

In Step S13, the plated layer 19 is formed on the base layer 18 by electrolytic plating, for example. The plated layer 19 is formed, with the base layer 18 including the step portion 20 being as an underlayer, and thus irregularities are formed along the irregularities of the base layer 18. Accordingly, as shown in FIG. 4, the upper stage surface 22 formed on the multi-layer structure including the first base layer $18a$ and the second base layer $18b$, the lower stage surface 23 formed on the single layer of the first base layer $18a$, and the standing surface 24 covering the step portion 20 that is the end portion of the second base layer $18b$, are formed.

The plated layer 19 may include, as an example, a three-layer plated film made of copper, nickel, and tin, but the plated layer 19 is not limited thereto. The plated layer 19 may have a single-layer structure, a two-layer structure, or a structure including a more number of layers.

As described above, the multi-layer ceramic capacitor 10 shown in FIGS. 1 to 3 is produced.

The multi-layer ceramic capacitor 10 is, for example, housed in the following substrate with a built-in electronic component 100.

4. Configuration of Substrate with Built-in Electronic Component 100

Figure 8:
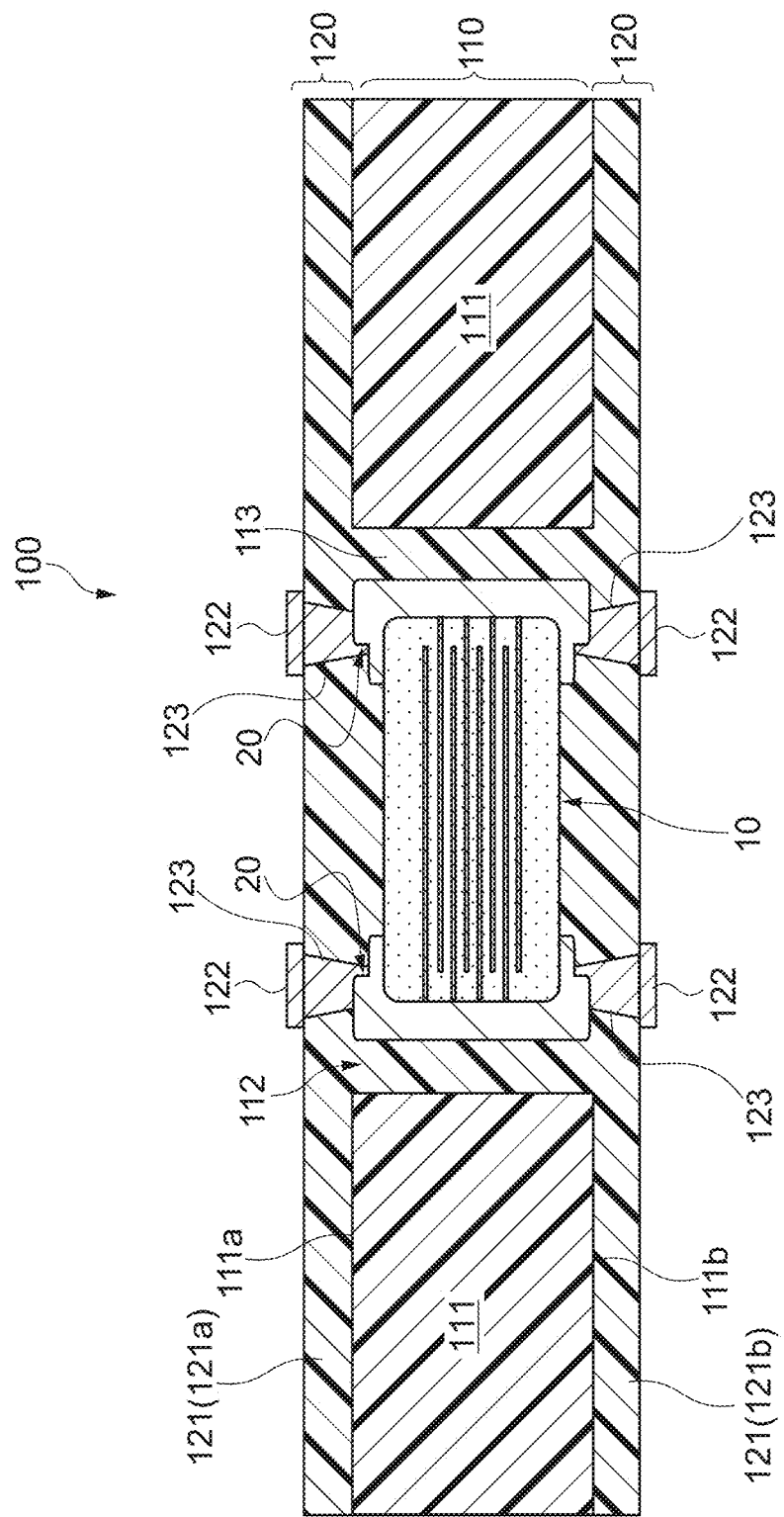
FIG. 8 is a cross-sectional view of a substrate with a built-in electronic component, the substrate housing the multi-layer ceramic capacitor.

FIG. 8 is a cross-sectional view of a substrate with a built-in electronic component 100 of this embodiment.

The substrate with a built-in electronic component 100 includes a housing layer 110 and a wiring layer 120. The housing layer 110 is configured to be capable of housing the multi-layer ceramic capacitor 10. The wiring layer 120 is formed on the housing layer 110.

The housing layer 110 includes a core member 111 and a cavity 112 capable of housing the multi-layer ceramic capacitor 10.

The core member 111 has functions of enhancing the rigidity of the substrate with a built-in electronic component 100 and protecting the multi-layer ceramic capacitor 10.

The core member 111 is a substrate made of, for example, a thermosetting resin, a thermoplastic resin, or prepreg. The characteristics of the core member 111 are adjusted by a reinforcing material (filler) or another additive. As an example, the core member 111 is made of a glass epoxy based resin to which a filler of glass fiber or the like is added.

The thickness dimension or shape of the core member 111 along the Z-axis direction is not particularly limited. For example, the core member 111 has the thickness dimension capable of housing the multi-layer ceramic capacitor 10 and is typically formed into a substantially rectangular shape.

In FIG. 8, the core member 111 has a surface facing upward in the Z-axis direction, which is a first core main surface 111a, and a surface facing downward in the Z-axis direction, which is a second core main surface 111b.

The cavity 112 is formed so as to have the size capable of housing the multi-layer ceramic capacitor 10. The cavity 112 is formed as a hole penetrating the core member 111 in FIG. 8, but the cavity 112 may be formed as a recessed portion having the bottom.

In the cavity 112, a filling material 113 is filled in a gap between the multi-layer ceramic capacitor 10 and the cavity 112. The filling material 113 contains, for example, an insulating resin, and contains a part of a material of an insulating layer 121 to be described later, an adhesive, or the like. The filling material 113 fixes the multi-layer ceramic capacitor 10 via the cavity 112 and the gap and satisfactorily protects the multi-layer ceramic capacitor 10.

The wiring layer 120 includes an insulating layer 121 formed on the housing layer 110, a conductor layer 122 formed on the insulating layer 121, and a connection electrode 123 formed on the insulating layer 121, thus having a configuration in which the insulating layer 121 and the conductor layer 122 are laminated in the Z-axis direction.

In the example shown in FIG. 8, the wiring layer 120 is provided to each of the first core main surface 111a and the second core main surface 111b of the core member 111.

The insulating layer 121 is made of, for example, an insulating resin material. For the material of the insulating layer 121, a thermosetting resin, a thermoplastic resin, prepreg, or the like can be used as appropriate. As an example, a glass epoxy resin to which glass fiber is added as a reinforcing material can be used.

In this embodiment, the insulating layer 121 includes a first insulating layer 121a on the first core main surface 111a of the core member 111 and a second insulating layer 121b on the second core main surface 111b of the core member 111. The first insulating layer 121a and the second insulating layer 121b are collectively referred to as the insulating layer 121.

The conductor layer 122 is made of a metal material, an electrically conductive paste, or the like, and is typically made of patterned copper foil. Further, although not shown in the figure, a superficial insulating layer of a solder resist, an insulating film, or the like may be formed so as to cover at least a part of the conductor layer 122.

The connection electrode 123 is formed as a via for interlayer connection, which is formed in the insulating layer 121.

Figure 9:
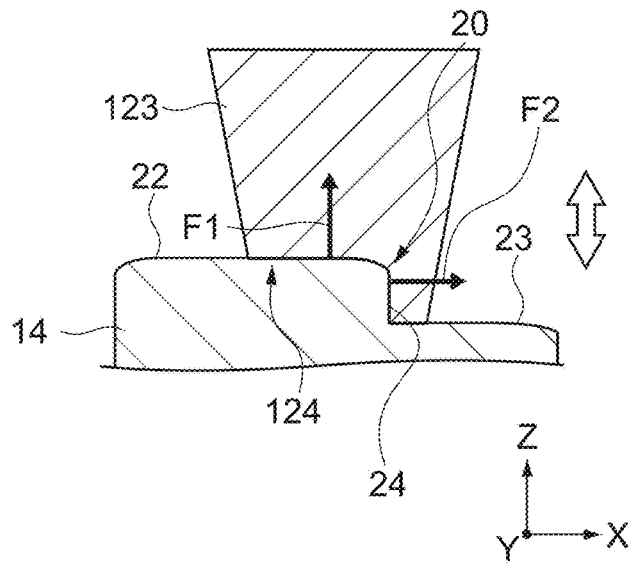
FIG. 9 is an enlarged view of FIG. 8 and also a view showing a connection portion between the multi-layer ceramic capacitor and a connection electrode of the substrate with a built-in electronic component.

FIG. 9 is an enlarged view of FIG. 8 and also a view showing a connection configuration of the external electrode 14 and the connection electrode 123.

The connection electrode 123 is connected to the external electrode 14 and the conductor layer 122 and is provided so as to face the step portion 20 in the Z-axis direction. A connection surface 124, which is an end surface of the connection electrode 123 on the external electrode 14 side, has an irregular shape corresponding to the irregularities of the surface of the external electrode 14. This allows the connection reliability with respect to the external electrode 14 to be enhanced as will be described later.

5. Method of Producing Substrate with Built-in Electronic Component 100

Figure 10:
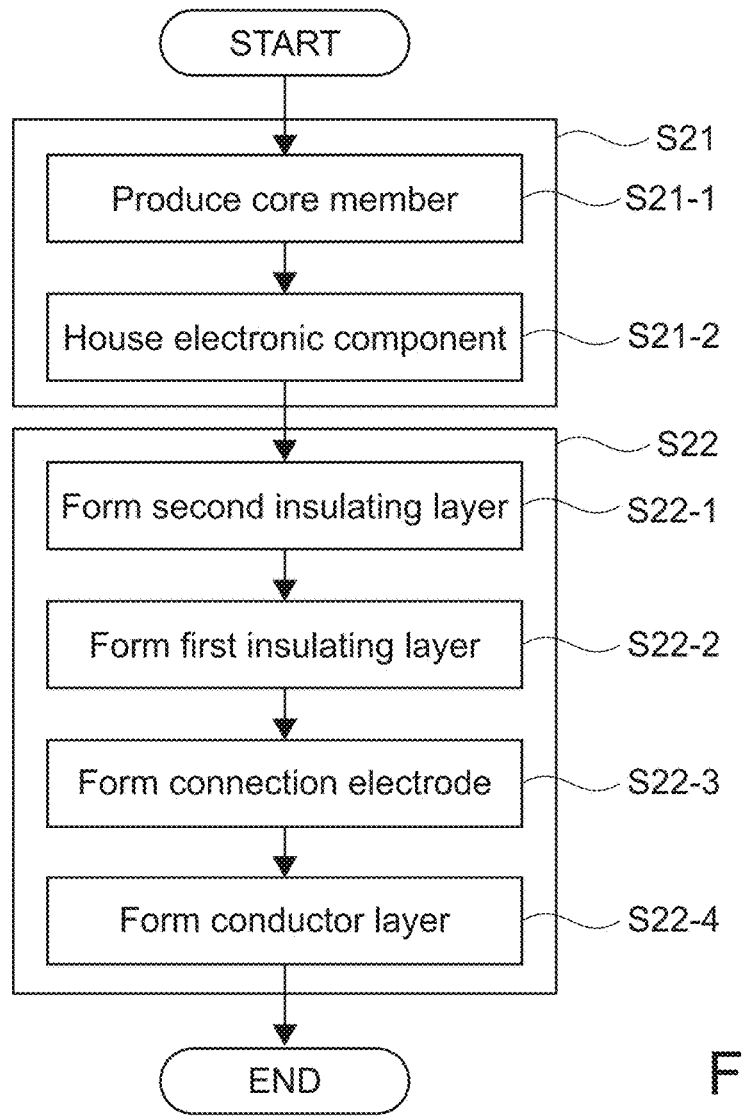
FIG. 10 is a flowchart showing a method of producing the substrate with a built-in electronic component.

FIG. 10 is a flowchart showing a method of producing the substrate with a built-in electronic component 100. FIGS. 11A to 13B are views each showing a production process of the substrate with a built-in electronic component 100. Hereinafter, the method of producing the substrate with a built-in electronic component 100 will be described along FIG. 10 with reference to FIGS. 11A to 13B as appropriate.

5.1 Step S21: Production of Housing Layer 110

In Step S21, the housing layer 110 in which the multi-layer ceramic capacitor 10 is to be housed is produced. The step of producing the housing layer 110 in Step S21 includes the step of producing the core member 111 (Step S21-1) and the step of housing the multi-layer ceramic capacitor 10 (electronic component) (Step S21-2).

Figure 11A:
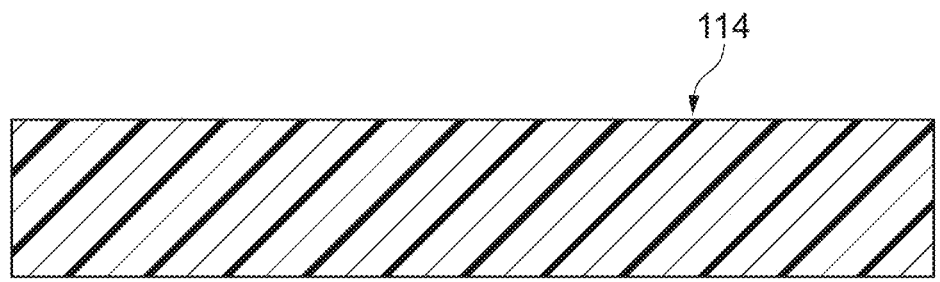
FIGS. 11A, 11B, and 11C are cross-sectional views each showing a production process of the substrate with a built-in electronic component.

In Step S21-1, as shown in FIG. 11A, a substrate 114 constituting the core member 111 is prepared. The substrate 114 is, as an example, a cured glass epoxy substrate. The substrate 114 may include a through-hole, wiring, or the like formed in advance.

Note that, in FIGS. 11A to 12B, the core member 111 is assumed to be disposed in a state where the first core main surface 111a faces downward in the Z-axis direction, and the second core main surface 111b faces upward in the Z-axis direction.

Figure 11B:
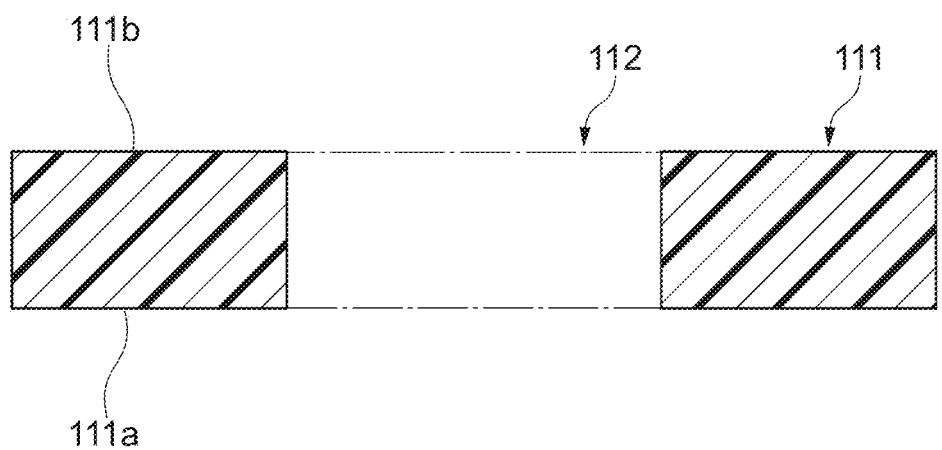

Subsequently, as shown in FIG. 11B, a cavity 112 for housing the multi-layer ceramic capacitor 10 is formed in the substrate 114. The cavity 112 is formed to penetrate the substrate 114 in the Z-axis direction by, for example, laser or the like.

Accordingly, the core member 111 including the cavity 112 is produced.

Figure 11C:
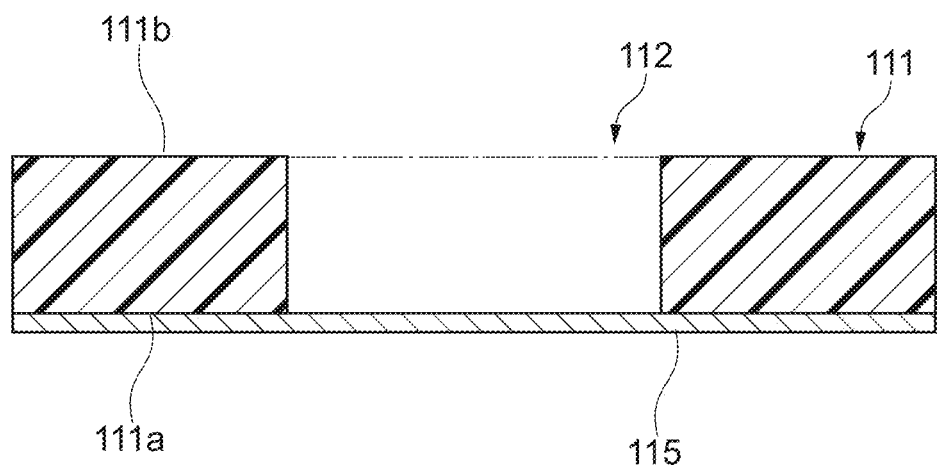

In Step S21-2, as shown in FIG. 11C, a carrier 115 containing, for example, polyethylene terephthalate (PET) is provided to the first core main surface 111a of the core member 111. The carrier 115 is bonded to the core member 111 by lamination, for example.

Figure 12A:
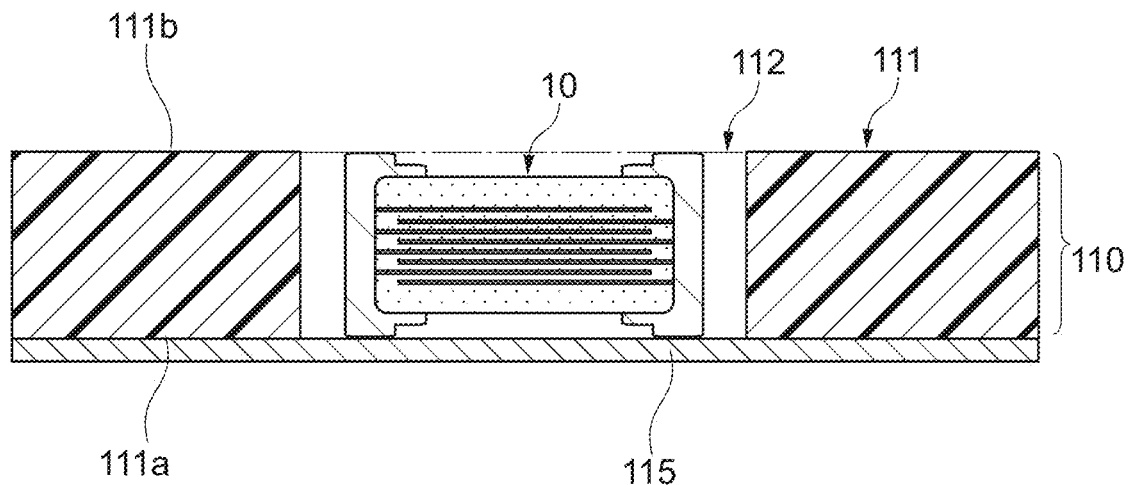
FIGS. 12A and 12B are cross-sectional views each showing a production process of the substrate with a built-in electronic component.

Subsequently, as shown in FIG. 12A, the multi-layer ceramic capacitor 10 is disposed in the cavity 112. Accordingly, the multi-layer ceramic capacitor 10 is housed within the cavity 112 while being bonded to the carrier 115.

5.2 Step S22: Formation of Wiring Layer 120

In Step S22, the wiring layer 120 is formed on the housing layer 110. The step of forming the wiring layer 120 in Step S22 includes the step of forming the second insulating layer 121b (Step S22-1), the step of forming the first insulating layer 121a (Step S22-2), the step of forming the connection electrode 123 (Step S22-3), and the step of forming the conductor layer 122 (Step S22-4).

Figure 12B:
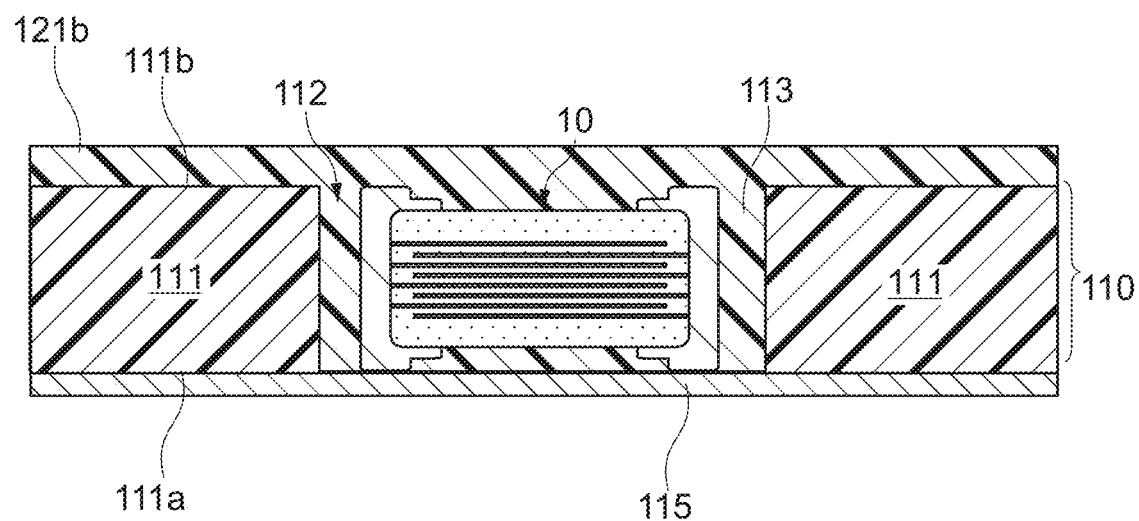

In Step S22-1, as shown in FIG. 12B, the second insulating layer 121b is formed on the second core main surface 111b of the core member 111. The second insulating layer 121b is, for example, an uncured glass epoxy based resin and is laminated on the second core main surface 111b of the core member 111 by vacuum lamination or the like. By heating when the second insulating layer 121b is laminated on the second core main surface 111b, the resin of the second insulating layer 121b is melted and adheres to the second core main surface 111b, and is also filled in the gap between the cavity 112 and the multi-layer ceramic capacitor 10. Accordingly, the second insulating layer 121b is formed, and at least a part of the filling material 113 is also formed.

Figure 13A:
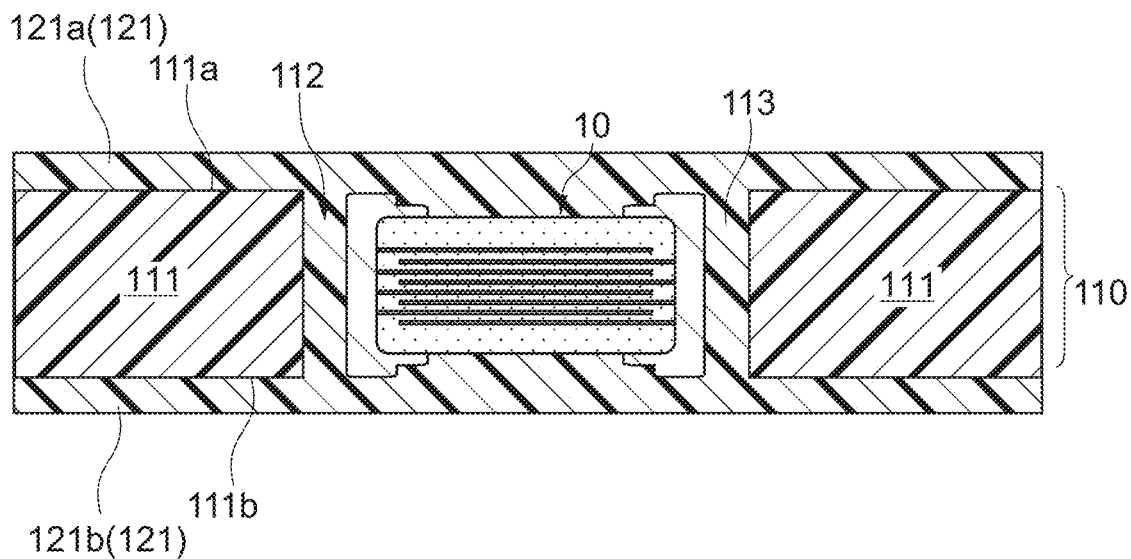
FIGS. 13A and 13B are cross-sectional views each showing a production process of the substrate with a built-in electronic component.

Subsequently, in Step S22-2, as shown in FIG. 13A, the first insulating layer 121a is formed on the first core main surface 111a of the core member 111, from which the carrier 115 has been removed. The first insulating layer 121a is also made of, for example, an uncured glass epoxy based resin. The resin is melted, and thus the first insulating layer 121a and the filling material 113 are simultaneously formed.

Figure 13B:
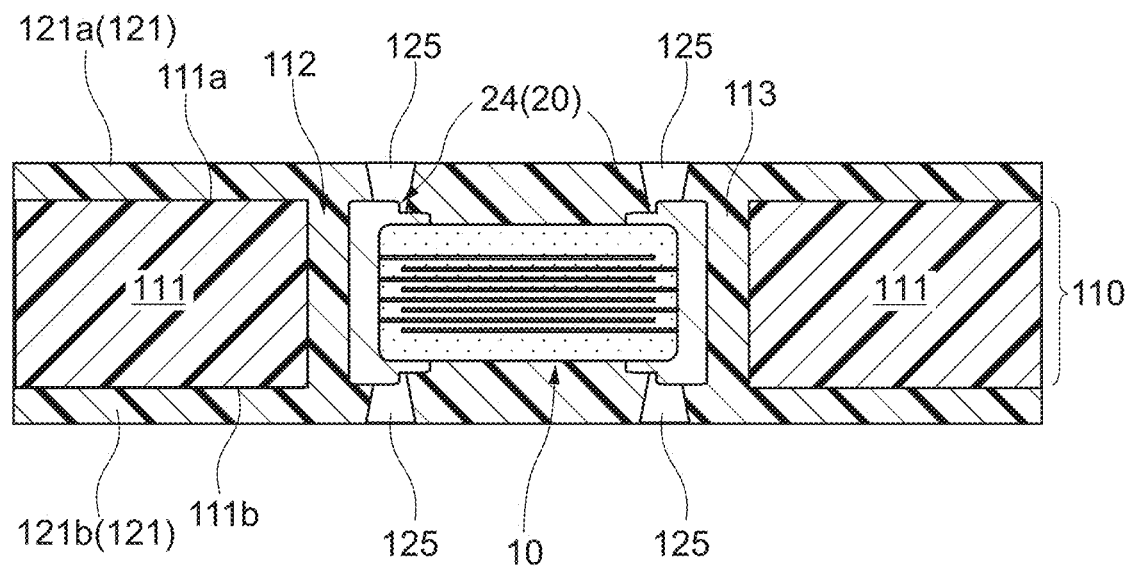

Note that, in FIGS. 13A and 13B, the core member 111 is inverted in the Z-axis direction from the state of FIGS. 12A and 12B, in which the first core main surface 111a faces upward in the Z-axis direction, and the second core main surface 111b faces downward in the Z-axis direction.

In Step S22-3, the connection electrode 123 is formed at a position facing the step portion 20 in the Z-axis direction.

As shown in FIG. 13B, first, a via hole 125 is formed in the insulating layer 121. The via hole 125 is formed by, for example, laser. Accordingly, a difference in level including the standing surface 24 of the external electrode 14 is exposed. For example, the via hole 125 may be formed in both or one of the first insulating layer 121a and the second insulating layer 121b.

Subsequently, a conductor is embedded in the via hole 125 to form the connection electrode 123. The connection electrode 123 is formed by electrolytic plating, for example, with a region including the standing surface 24 of the external electrode 14 being as an underlayer. With this configuration, as shown in FIGS. 8 and 9, the connection electrode 123 including the connection surface 124 with the shape corresponding to the step portion 20 is formed on the step portion 20 of the external electrode 14.

In Step S22-4, the conductor layer 122 is formed by, for example, a semi-additive method, a subtractive method, or the like. In the case where the semi-additive method is applied, for example, both the first insulating layer 121a and the second insulating layer 121b are covered with a patterned plating resist, and a part that is not covered with the resist is selectively subjected to electrolytic plating. Thus, the conductor layer 122 is formed.

The embedding of the conductor of the connection electrode 123 in Step S22-3 and the formation of the conductor layer 122 in Step S22-4 may be simultaneously formed.

As described above, the substrate with a built-in electronic component 100 shown in FIG. 8 is produced.

6. Action and Effect of Substrate with Built-in Electronic Component 100

When the substrate with a built-in electronic component 100 is driven, heating and cooling are repeated by the mounted and built-in electronic component. As described above, the core member 111 and the insulating layer 121 are made of the insulating resins, and thus have thermal expansion coefficients different from that of the multi-layer ceramic capacitor 10. Thus, stress in the Z-axis direction, which results from the difference in thermal expansion rate, is applied between the external electrode 14 of the multi-layer ceramic capacitor 10 and the connection electrode 123 (see the outlined arrows in FIGS. 9 and 14). In particular, in the case where a heat-generating component such as a semiconductor chip is mounted onto the conductor layer 122, a calorific value increases, and the stress to be applied increases.

Figure 14:
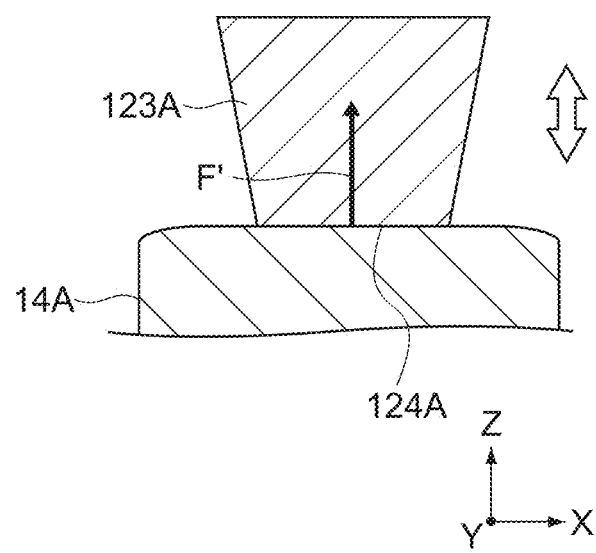
FIG. 14 is a view showing a connection portion between an external electrode of a multi-layer ceramic capacitor and a connection electrode according to Comparative Example of this embodiment.

FIG. 14 is a schematic enlarged cross-sectional view of a substrate with a built-in electronic component according to Comparative Example of this embodiment and is also a view of a part corresponding to FIG. 9.

In Comparative Example shown in FIG. 14, an external electrode 14A of a multi-layer ceramic capacitor 10A does not include a step portion. As a result, a connection surface 124A of a connection electrode 123A is also formed as a substantially flat surface facing in the Z-axis direction.

A force F' for separating the connection surface 124A of the connection electrode 123A and the external electrode 14A from each other has only an orientation nearly parallel to the Z-axis direction. So, when the stress in the Z-axis direction is applied, a break or a conduction failure is likely to occur, and the connection strength in the connection surface 124A is difficult to sufficiently ensure.

Meanwhile, in this embodiment, as shown in FIG. 9, the connection surface 124 of the connection electrode 123 includes the difference in level resulting from the step portion 20. Accordingly, in order to completely separate the connection electrode 123 and the external electrode 14 from each other, a force F2 for separating the standing surface 24 from the connection electrode 123 is also necessary in addition to a force F1 for separating the upper stage surface 22 and the lower stage surface 23 from the connection electrode 123, the force F1 being parallel to the Z-axis direction. The force F2 has a direction that is orthogonal to the standing surface 24 (for example, the X-axis direction) and intersects with the Z-axis direction. Accordingly, even if the stress in the Z-axis direction is applied, the state where the standing surface 24 and the connection surface 124 are in contact with each other is likely to be maintained, and the generation of a break or a conduction failure can be suppressed. So, the connection strength of the external electrode 14 and the connection surface 124 can be enhanced, and the reliability can be improved.

Further, due to a recent tendency toward the miniaturization of electronic components, the multi-layer ceramic capacitor 10 and a diameter of the connection electrode (via hole) 123 connected thereto tend to be made small.

According to this embodiment, a ratio of the connection area of the connection electrode 123 and the external electrode 14 to the diameter of the connection electrode 123 can be increased by the step portion 20. This makes it possible to enhance the connection strength in the external electrode 14 and the connection electrode 123 and provide a substrate with a built-in electronic component 100, which is small and has high reliability.

II Second Embodiment

Figure 15:
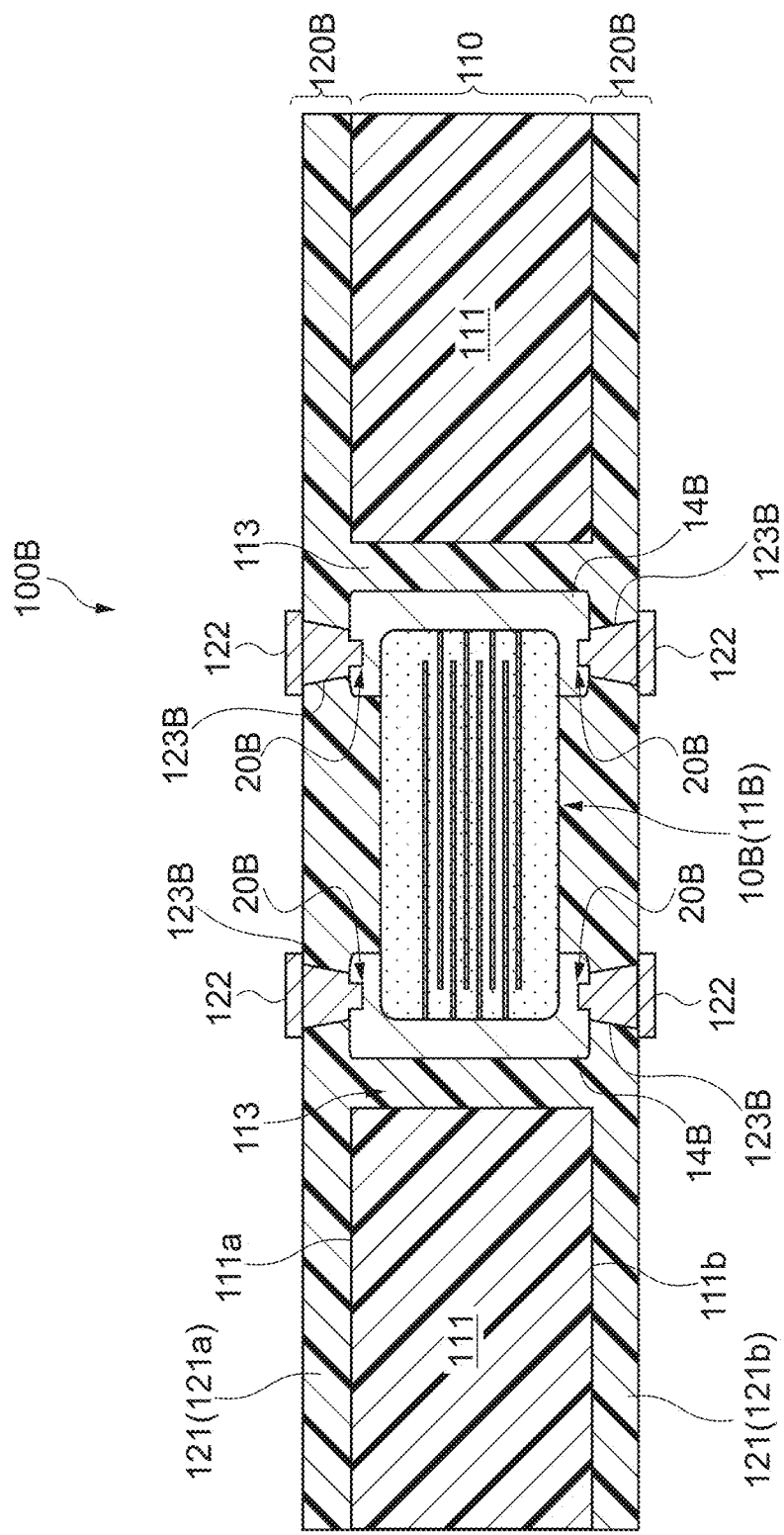
FIG. 15 is a cross-sectional view of a substrate with a built-in electronic component according to a second embodiment of the present disclosure.
Figure 16:
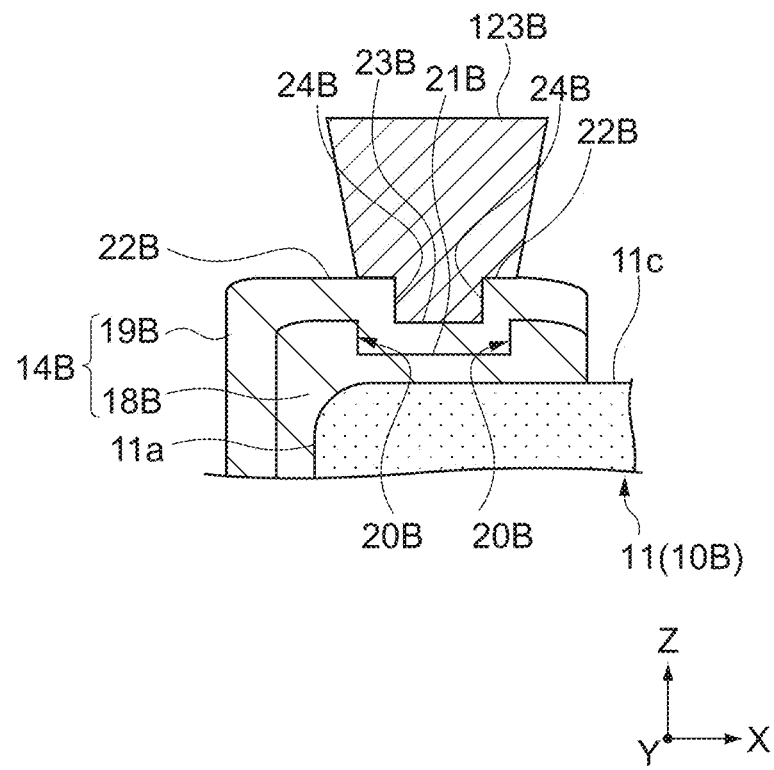
FIG. 16 is an enlarged view of FIG. 15 and also a view showing a connection portion between a multi-layer ceramic capacitor and a connection electrode of the substrate with a built-in electronic component.

FIG. 15 is a cross-sectional view of a substrate with a built-in electronic component according to a second embodiment of the present disclosure. FIG. 16 is an enlarged view of FIG. 15.

As shown in FIGS. 15 and 16, a substrate with a built-in electronic component 100B includes a multi-layer ceramic capacitor 10B, a housing layer 110, and a wiring layer 120B. The wiring layer 120B includes an insulating layer 121, a conductor layer 122, and a connection electrode 123B. Configurations similar to those of the first embodiment are denoted by the same reference symbols, and description thereof will be omitted.

The multi-layer ceramic capacitor 10B includes external electrodes 14B and a ceramic body 11. The external electrode 14B is different from the external electrode 14 of the first embodiment in the configuration of a step portion 20B.

A base layer 18B includes a plurality of step portions 20B formed on the main surface 11c. As in the first embodiment, an angle formed by each of the step portions 20B and the base is 60 to 135 degrees. As a result, a plated layer 19B also includes a plurality of standing surfaces 24B. For example, the surface of the plated layer 19B includes a lower stage surface 23B, a plurality of standing surfaces 24B formed at both end portions of the lower stage surface 23B in the X-axis direction, and a plurality of upper stage surfaces 22B connected to the respective standing surfaces 24B. The standing surface 24B is a surface formed on the surface of the plated layer 19B so as to correspond to the step portion 20B. The standing surface 24B is a surface that covers the step portion 20B and has an angle formed together with the lower stage surface 23B in the range from 60 to 135 degrees.

The step portions 20B are formed for a single connection electrode 123B. In the example shown in FIG. 16, two step portions 20B are formed for a single connection electrode 123B. The two step portions 20B are disposed to face each other in the X-axis direction with a base 21B being sandwiched therebetween, for example.

For example, the step portion 20B (base layer 18B) is formed by printing an electrically conductive paste a plurality of times.

Specifically, first, as shown in FIG. 7A of the first embodiment, a first base layer 18a is formed of an electrically conductive paste in a circumferential portion of the main surface 11c in the X-axis direction by printing.

Figure 17:
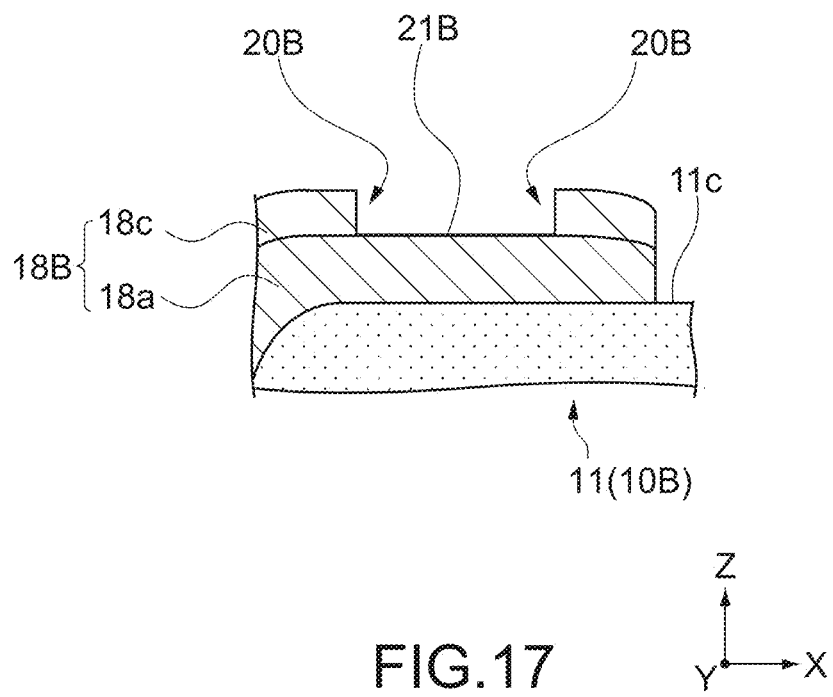
FIG. 17 is a cross-sectional view showing a production process of the substrate with a built-in electronic component.

Subsequently, as shown in FIG. 17, a second base layer 18c is formed of the electrically conductive paste on the first base layer 18a by printing. The second base layer 18c is formed at a portion of the first base layer 18a, the portion excluding the base 21. Accordingly, the plurality of step portions 20B are easily formed.

Note that, although not shown in the figure, simultaneously with or after the formation of the second base layer 18c, the electrically conductive paste is applied to the end surface 11a, and the base layer 18B is formed.

In the substrate with a built-in electronic component 100B shown in FIGS. 15 and 16, the plurality of standing surfaces 24B are formed for the single connection electrode 123B. In order to peel off the connection electrode 123B from the external electrode 14B, force in more complicated directions is necessary. Accordingly, it is possible to enhance the connection strength between the external electrode 14B and the connection electrode 123B and enhance the resistance properties with respect to the stress applied in the Z-axis direction. So, it is possible to further improve the connection reliability of the external electrode 14B and the connection electrode 123B.

Figure 18:
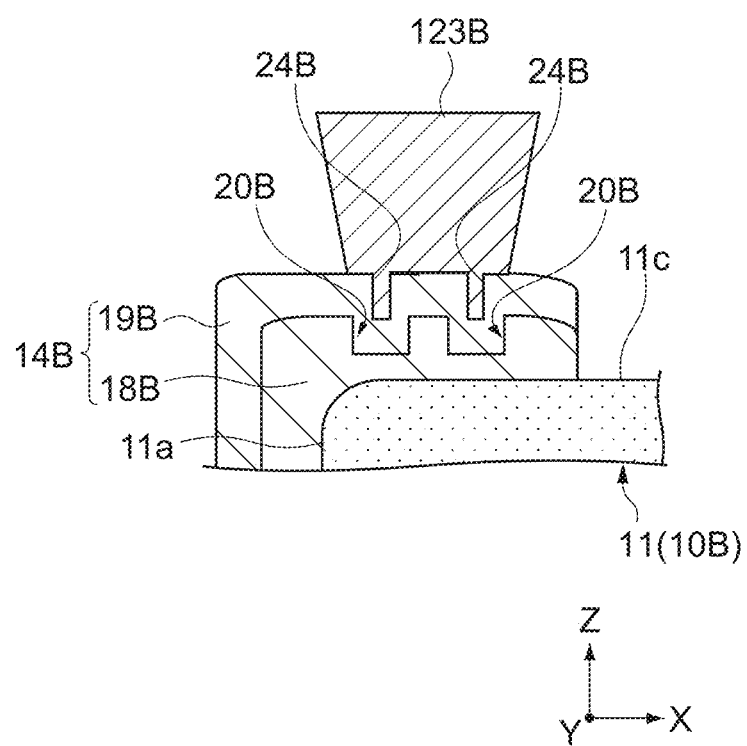
FIG. 18 is a cross-sectional view showing a part of a substrate with a built-in electronic component according to a modified example of the second embodiment.

FIG. 18 is an enlarged cross-sectional view of the configurations of the connection electrode 123B and the external electrode 14B according to a modified example in this embodiment.

As shown in FIG. 18, the external electrode 14B may include many step portions 20B and standing surfaces 24B, for example, three or more step portions 20B and standing surfaces 24B. The structure of each step portion 20B and the structure of each standing surface 24B are similar to those described in the first and second embodiments. Accordingly, the connection reliability of the external electrode 14B and the connection electrode 123B can further be enhanced.

III Third Embodiment

Figure 19:
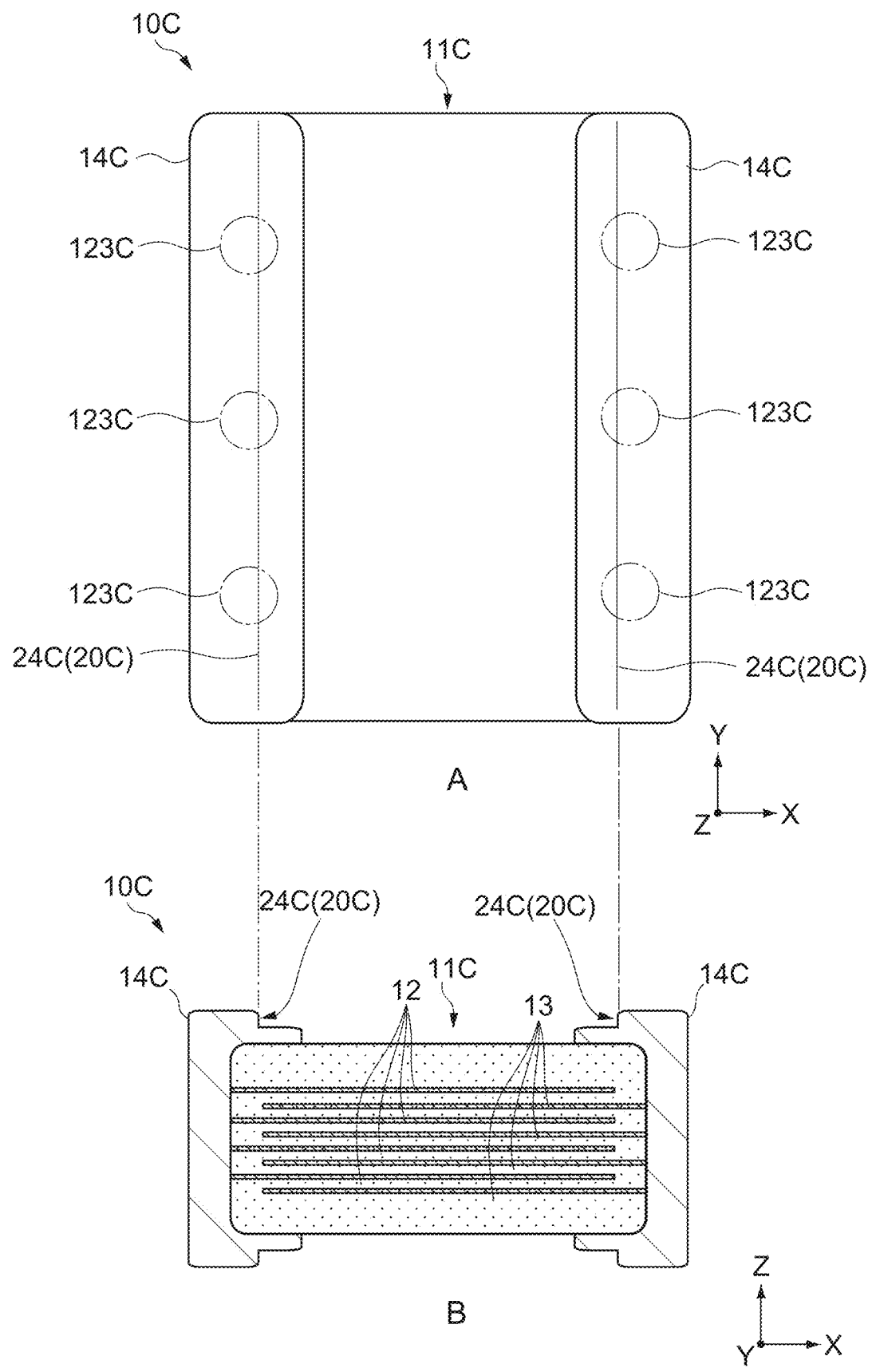
FIG. 19 is a view of a multi-layer ceramic capacitor according to a third embodiment of the present disclosure, in which A is a plan view, and B is a cross-sectional view.

FIG. 19 is a view of a multi-layer ceramic capacitor 10C according to a third embodiment of the present disclosure, in which A is a plan view, and B is a cross-sectional view.

As shown in FIG. 19, a ceramic body 11C of the multi-layer ceramic capacitor 10C is long in the Y-axis direction, and a step portion 20C and a standing surface 24C are extended in the Y-axis direction.

In a substrate with a built-in electronic component (not shown), in which the multi-layer ceramic capacitor 10C is housed, a plurality of connection electrodes 123C can be formed for a single step portion 20C. In the example shown in FIG. 19, the plurality of connection electrodes 123C are disposed side by side along the Y-axis direction. Accordingly, even in the case where the multi-layer ceramic capacitor 10C is miniaturized and the diameter of the connection electrode 123C is difficult to sufficiently ensure, an area of connection with the connection electrode 123C can be increased. So, it is possible to enhance the connection strength between the external electrode 14C and the connection electrode 123C and provide a substrate with a built-in electronic component, which is small and has high heat resistance.

Further, the plurality of connection electrodes 123C are formed for the single step portion 20C, which makes it possible to increase a connection area of the external electrode 14C and the connection electrode 123C (wiring), as the whole substrate with a built-in electronic component, without complicating the configuration of the step portion 20C.

IV Other Embodiments

Hereinabove, while the embodiments of the present disclosure have been described, the present disclosure is not limited to the embodiments described above and can be variously modified without departing from the gist of the present disclosure as a matter of course. For example, the embodiments of the present disclosure can be an embodiment obtained by combining the embodiments.

The configuration of the substrate with a built-in electronic component is not limited to the above description. For example, another insulating layer such as a bonding layer may be disposed between the insulating layer and the housing layer as needed.

In the embodiments described above, the example in which the multi-layer ceramic capacitor is housed in the substrate with a built-in electronic component has been described, but the multi-layer ceramic capacitor may be mounted to a wiring substrate, for example. Also in this case, the external electrodes and the wiring layer on the substrate are connected to each other in the Z-axis direction (one axial direction) by solder or the like. Thus, the step portion allows the connection strength to be enhanced and also allows the connection reliability to be enhanced.

Further, in the embodiments described above, the multi-layer ceramic capacitor has been described as an example of a ceramic electronic component, but the present disclosure can be applied to general multi-layer ceramic electronic components each including the internal electrodes alternately disposed. Examples of such multi-layer ceramic electronic components include a piezoelectric element.

The invention claimed is:

1. A substrate with a built-in electronic component comprising:
a multi-layer ceramic electronic component including
a ceramic body including internal electrodes laminated in a first axial direction and having a first main surface and a second main surface substantially orthogonal to the first axial direction, and
an external electrode including
a base layer including a step portion formed on the first main surface, and
a plated layer formed on the base layer,
the external electrode being connected to the internal electrodes;
a housing layer housing the multi-layer ceramic electronic component; and
a wiring layer including
an insulating layer formed on the housing layer,
a conductor layer formed on the insulating layer, and
a connection electrode connected to the external electrode and the conductor layer and formed in the insulating layer to face the step portion in the first axial direction,
wherein the connection electrode having a connection surface in contact with the external electrode,
wherein the plated layer on the step portion on the first main surface comprises an upper stage surface, a lower stage surface, and a standing surface that connects the upper stage surface and the lower stage surface, and
wherein the connection surface is in direct contact with the lower stage surface, the standing surface, and only a portion of the upper stage surface.

2. The substrate with a built-in electronic component to claim 1, wherein
the step portion has a height dimension of 1 μm or more and 15 μm or less along the first axial direction.

3. The substrate with a built-in electronic component according to claim 2, wherein
the step portion has a height dimension of 2 μm or more and 5 μm or less along the first axial direction.

4. The substrate with a built-in electronic component according to claim 1, wherein
an angle between the step portion and its base is in the range of 60 degrees or more and 135 degrees or less.

5. The substrate with a built-in electronic component according to claim 1, wherein
an angle between the standing surface and the lower stage surface is in the range of 60 degrees or more and 135 degrees or less.

6. The substrate with a built-in electronic component according to claim 1, wherein
the plated layer has a single-layer structure.

7. The substrate with a built-in electronic component according to claim 6, wherein
the plated layer contains copper.

8. The substrate with a built-in electronic component according to claim 1, wherein
the plated layer has a multi-layer structure.

9. The substrate with a built-in electronic component according to claim 8, wherein
the plated layer contains copper.

10. The substrate with a built-in electronic component according to claim 8, wherein
the plated layer contains nickel.

11. The substrate with a built-in electronic component according to claim 1, wherein
the base layer contains nickel.

12. The substrate with a built-in electronic component according to claim 1, wherein
the base layer contains copper.

13. A substrate with a built-in electronic component comprising:
a multi-layer ceramic electronic component including
a ceramic body including internal electrodes laminated in a first axial direction and having a first main surface and a second main surface substantially orthogonal to the first axial direction, and
an external electrode including
a base layer including a first step portion formed on the first main surface and a second step portion formed on the second main surface, and
a plated layer formed on the base layer,
the external electrode being connected to the internal electrodes;
a housing layer housing the multi-layer ceramic electronic component; and
a wiring layer including
a first insulating layer formed on the housing layer and positioned above the first main surface,
a second insulating layer formed on the housing layer positioned above the second main surface,
a first conductor layer formed on the first insulating layer,
a second conductor layer formed on the second insulating layer,
a first connection electrode connected to the external electrode and the first conductor layer and formed in the first insulating layer to face the first step portion in the first axial direction, and
a second connection electrode connected to the external electrode and the second conductor layer and formed in the second insulating layer to face the second step portion in the first axial direction,
wherein the first connection electrode having a first connection surface in contact with the external electrode,
wherein the second connection electrode having a second connection surface in contact with the external electrode,
wherein the plated layer on the first step portion on the first main surface comprises a first upper stage surface, a first lower stage surface, and a first standing surface that connects the first upper stage surface and the first lower stage surface,
wherein the plated layer further on the second step portion on the second main surface comprises a second upper stage surface, a second lower stage surface, and a second standing surface that connects the second upper stage surface and the second lower stage surface,
wherein the first connection surface is in direct contact with the first lower stage surface, the first standing surface, and only a portion of the first upper stage surface, and
wherein the second connection surface is in direct contact with the second lower stage surface, the second standing surface, and only a portion of the second upper stage surface.

14. The substrate with a built-in electronic component to claim 13, wherein
the first step portion and the second step portion each have height dimensions of 1 μm or more and 15 μm or less along the first axial direction.

15. The substrate with a built-in electronic component according to claim 14, wherein the first step portion and the second step portion each have height dimensions of 2 μm or more and 5 μm or less along the first axial direction.

16. The substrate with a built-in electronic component according to claim 13, wherein
a first angle between the first step portion and its base and a second angle between the second step portion and its base are each in the range of 60 degrees or more and 135 degrees or less.

17. The substrate with a built-in electronic component according to claim 13, wherein
a third angle between the first standing surface and the first lower stage surface and a fourth angle between the second standing surface and the second lower stage surface are each in the range of 60 degrees or more and 135 degrees or less.

18. The substrate with a built-in electronic component according to claim 13, wherein
the plated layer has a single-layer structure.

19. The substrate with a built-in electronic component according to claim 18, wherein
the plated layer contains copper.

20. The substrate with a built-in electronic component according to claim 13, wherein
the plated layer has a multi-layer structure.

* * * * *